United States Patent [19]

Charache et al.

[11] Patent Number: 5,769,964
[45] Date of Patent: Jun. 23, 1998

[54] BULK SINGLE CRYSTAL TERNARY SUBSTRATES FOR A THERMOPHOTOVOLTAIC ENERGY CONVERSION SYSTEM

[75] Inventors: Greg W. Charache; Paul F. Baldasaro, both of Clifton Park; Greg J. Nichols, Burnt Hills, all of N.Y.

[73] Assignee: The United States of America as reprresented by the United States Department of Energy, Washington, D.C.

[21] Appl. No.: 704,974

[22] Filed: Aug. 29, 1996

[51] Int. Cl.⁶ .................................................. H01L 31/036
[52] U.S. Cl. .......................... 136/262; 136/252; 136/253; 257/441; 438/93
[58] Field of Search .................................. 136/252, 253, 136/262; 257/441; 438/93

[56] References Cited

U.S. PATENT DOCUMENTS

| | | | |
|---|---|---|---|
| 4,547,622 | 10/1985 | Fan et al. | 136/249 |
| 5,091,018 | 2/1992 | Fraas et al. | 136/246 |
| 5,439,532 | 8/1995 | Fraas | 136/253 |

OTHER PUBLICATIONS

P.F. Baldasaro et al, "Experimental Assessment of Low Temperature Voltaic Energy Conversion", 1st NREL Conference on Thermo–Photovoltaic Generation of Electricity, Jul. 24–27, 1994.

L.D. Woolf, "Optimum Efficiency Of Single And Multiple Bandgap Cells In Thermophotovoltaic Energy Conversion", Solar Cells, 19, 1987, pp. 19–38.

KAPL Report 4778, "Feasibility Assessment of Low Temperature Voltaic Energy Conversion", 1993.

*Primary Examiner*—Nam Nguyen
*Attorney, Agent, or Firm*—Virginia B. Caress; William R. Moser; Paul A. Gottlieb

[57] ABSTRACT

A thermophotovoltaic energy conversion device and a method for making the device. The device includes a substrate formed from a bulk single crystal material having a bandgap ($E_g$) of 0.4 eV<$E_g$<0.7 eV and an emitter fabricated on the substrate formed from one of a p-type or an n-type material. Another thermophotovoltaic energy conversion device includes a host substrate formed from a bulk single crystal material and lattice-matched ternary or quaternary III-V semiconductor active layers.

18 Claims, 7 Drawing Sheets

$Al_{1-x}In_xP_{1-y}Sb_y$ $Ga_{1-x}In_xAs_{1-y}Sb_y$ $Ga_{1-x}In_xP_{1-y}As_y$ $Ga_{1-x}In_xP_{1-y}Sb_y$

BULK SINGLE CRYSTAL TERNARY SUBSTRATES FOR A THERMOPHOTOVOLTAIC ENERGY CONVERSION SYSTEM

RIGHTS OF THE GOVERNMENT

The United States government has rights in this invention pursuant to Contract No. DE-AC12-76SN00052, awarded by The U.S. Department of Energy.

BACKGROUND OF THE INVENTION

1. Field of Invention

The present invention relates to the field of thermophotovoltaic (TPV) direct energy conversion. In particular, the present invention relates to bulk single crystal III-V semiconductor substrates as materials for use as both energy conversion devices and starting substrates for the epitaxial growth of TPV active layers.

2. Description of the Related Art

Thermophotovoltaic (TPV) energy systems convert thermal energy to electric power using, the same principle of operation as solar cells. In particular, a heat source radiatively emits photons that are incident on a semiconductor TPV cell. Photons with an energy greater than the bandgap ($E_g$) of the semiconductor cell excite electrons from the valence band to the conduction band (interband transition). The resultant electron hole pairs (ehp) are then collected by metal contacts that can power an electrical load.

In order to maximize efficiency and/or power density of a TPV system, the bandgap of the semiconductor is matched to the radiator temperature, as described by L. D. Woolf in Optimum Efficiency of Single and Multiple Bandgap Cells in Thermophotovoltaic Energy Conversion, Solar Cells, Vol. 19, pp. 19–30, 1987. For a given radiator temperature, increasing the bandgap will generally increase device efficiency, while decreasing the bandgap will generally increase power density, as described in KAPL Report 4778, Feasibility Assessment of Low Temperature Voltaic Energy Conversion, 1993.

Currently, bandgap variation is achieved by growing ternary (three-component) and quaternary (four-component) epitaxial III-V semiconductors layers on binary (two-component) substrates. III-V semiconductors are formed from elements from groups III and V of the Periodic Table. Ternary semiconductors vary both the bandgap and lattice constant as the composition changes between the binary endpoints. For example, FIG. 1 shows that the room temperature InGaAs bandgap (Energy Gap) and lattice constant ($a_o$) can be varied between InAs ($E_g$=0.36 eV, $a_o$=6.0584Å) and GaAs ($E_g$=1.41 eV and $a_o$=5.6533Å). Only a limited number of ternary semiconductors can be grown lattice matched to available binary substrates, and these particular ternary semiconductors have only discrete energy bandgaps. For example, $In_{0.53}Ga_{0.47}As$ is lattice matched to InP with a bandgap of 0.73 eV. A lattice-matched constraint, which is desired for the highest performance devices, severely limits the number of material options available for ternary epitaxial layers grown on binary substrates.

Quaternary semiconductors have the advantage of independent variation of both the bandgap and lattice constant. Thus, lattice matched growth of a number of different bandgaps of the same material may be accomplished. For example, InGaAsSb may be grown lattice matched to GaSb substrates with bandgaps that range from 0.7–0.3 eV. However, a number of these compositions lie within a region of thermodynamic instability (miscibility gap), that preclude fabrication of high quality TPV devices.

SUMMARY OF THE INVENTION

The present invention provides bulk single crystal ternary III-V semiconductor substrates that offer the advantage of synthesis of a single crystal material of a desired bandgap directly from a liquid melt. Ternary substrates may be used as a single crystal seed for the epitaxial growth of lattice-matched ternary or quaternary TPV active layers (a base layer and an emitter layer). This provides another degree of freedom when choosing and designing TPV devices from a number of available material systems.

In this regard, one embodiment of the present invention provides a thermophotovoltaic energy conversion device which includes a substrate formed from a bulk single crystal material having a bandgap ($E_g$) of 0.4 eV<$E_g$<0.7 eV and selected from the group of AlInAs, AlInSb, GaAsSb, GaInAs, GaInSb and InPAs. In this case, the ternary substrate forms the base layer of the TPV device and an emitter is formed by ion-implantation or diffusion of the appropriate dopant (n-type or p-type). Possible n-type dopants would be selected from group VI of the Periodic Table, and p-type would be selected from group II of the Periodic Table.

Another embodiment of the present invention provides a thermophotovoltaic energy conversion device which includes a host substrate formed from a bulk single crystal material selected from the group of AlAsSb, AlInAs, GaAsSb, GaInAs and InPAs, and lattice-matched ternary or quaternary III-V semiconductor active layers (an emitter and a base) are formed from one of the group of AlInAs, GaAsSb, GaInAs, InPAs, AlGaAsSb, AlGaInAs, AlInAsSb, AlInPAs, AlInPSb, GaInAsSb, GaInPAs, GaInPSb and InPAsSb. The emitter layer and the base layer are formed from the same material but are doped differently. When the host substrate is AlAsSb, the group forming the semiconductor active layers further includes GaInSb.

Yet another embodiment of the present invention provides a thermophotovoltaic energy conversion device that includes a host substrate formed from a bulk single crystal material selected from the group of AlGaSb, AlInSb and GaInSb, and lattice-matched ternary or quaternary III-V semiconductor active layers formed from one of the group of GaInSb, AlGaInSb, AlInAsSb, AlInPSb, GaInAsSb, GaInPSb and InPAsSb.

The present invention also provides a method of forming a thermophotovoltaic energy conversion device using the steps of forming a substrate from a bulk single crystal material having a bandgap ($E_g$) of 0.4 eV<$E_g$<0.7 eV, and selecting the substrate from the group of AlInAs, AlInSb, GaAsSb, GaInAs, GaInSb and InPAs. The ternary substrate will form the base layer of the TPV device and may be either n-type or p-type material. An emitter is formed on the substrate by ion implantation or by diffusion of the appropriate dopant. The emitter being formed may be either p-type or n-type material.

In one embodiment, the method of forming a thermophotovoltaic device includes the steps of forming a host substrate from a bulk single crystal material selected from the group of AlAsSb, AlInAs, GaAsSb, GaInAs and InPAs, and forming lattice-matched ternary or quaternary III-V semiconductor active layers formed from one of the group of AlInAs, GaAsSb, GaInAs, InPAs, AlGaAsSb, AlGaInAs, AlAsSb, AlInPAs, AlInPSb, GaInAsSb, GaInPAs, GaInPSb and InPAsSb. When the host substrate is AlAsSb, the group forming the semiconductor active layers further includes GaInSb.

In another embodiment, the method of the invention includes the steps of forming a host substrate from a bulk single crystal material selected from the group of AlGaSb, AlInSb and GaInSb, and forming lattice-matched ternary or quaternary III-V semiconductor active layers formed from one of the group of GaInSb, AlGaInSb, AlInAsSb, AlInPSb, GaInAsSb, GaInPSb and InPAsSb.

BRIEF DESCRIPTION OF THE DRAWINGS

The present invention is illustrated by way of example and not limitation in the accompanying figures in which like reference numerals indicate similar elements and in which.

DETAILED DESCRIPTION OF THE PREFERRED EMBODIMENTS

Figure 1:
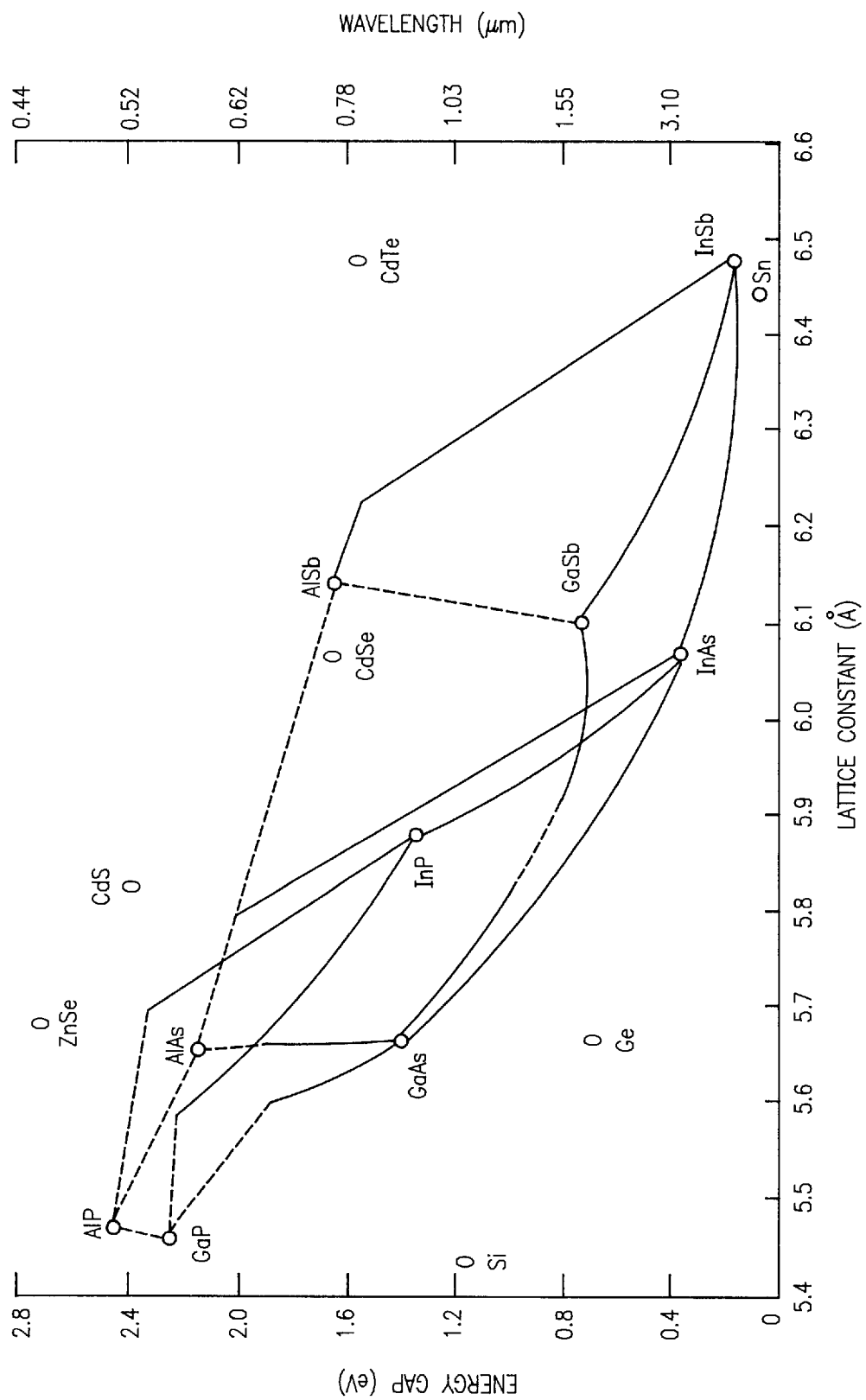
FIG. 1 shows a graph of energy gap versus lattice constant for III-V semiconductors.
Figure 2:
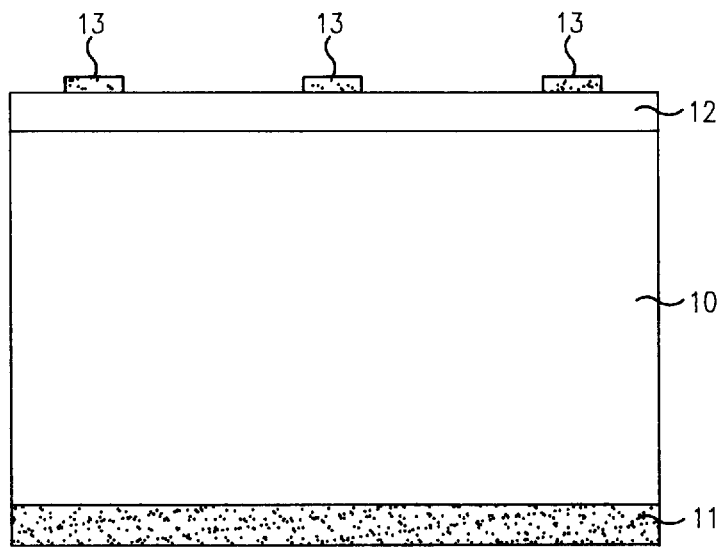
FIG. 2 is a cross-sectional diagram of a ternary substrate TPV device having a diff-used or ion-implanted junction according to the present invention.

For TPV systems, active layers (emitter and base) having bandgaps that range from 0.4 to 0.7 eV match well to radiator temperatures that vary between 800°–2000° C. FIG. 1 shows that there are six different ternary materials that fall into this bandgap range: AlInAs, AlInSb, GaAsSb, GaInAs, GaInSb, and InPAs. Bulk growth of these materials enables fabrication of simple diffused junction or ion-implanted junction TPV devices that are produced with a reduced cost in comparison to an epitaxially grown TPV device. FIG. 2 shows a cross-sectional diagram of a bulk grown ternary substrate TPV device having a junction that can be either a diff-used or an ion-implanted junction. An n- or p-type bulk single crystal ternary substrate 10 having a bandgap between 0.4–0.7 eV forms the base layer. A junction is formed on substrate 10 by ion-implantation or diffusion of the appropriate dopant to form a p- or n-type emitter 12. Front side metal grids 13 and back contacts 11 are formed on emitter 12 and substrate 10, respectively, using conventional techniques.

Figure 3:
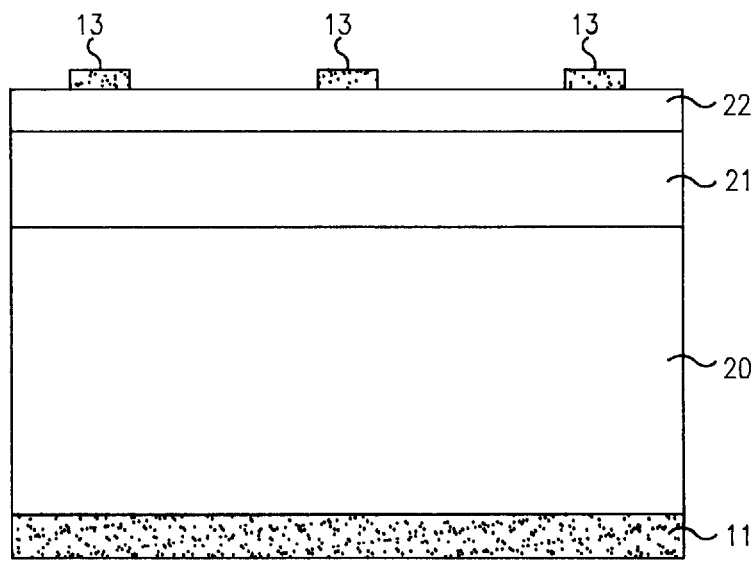
FIG. 3 is a cross-sectional diagram of a ternary substrate TPV device according to the present invention having epitaxially grown lattice-matched ternary or quaternary active layers.
Figure 4:
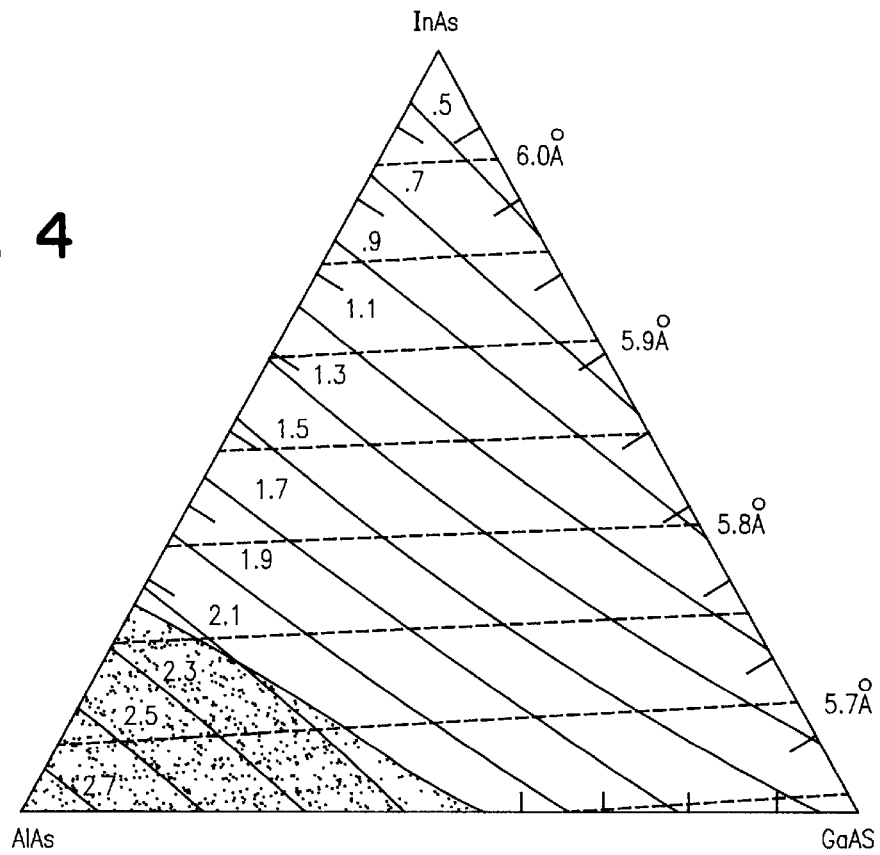
FIG. 4 shows a graph of energy gap and lattice constant versus composition of AlGaInAs.
Figure 5:
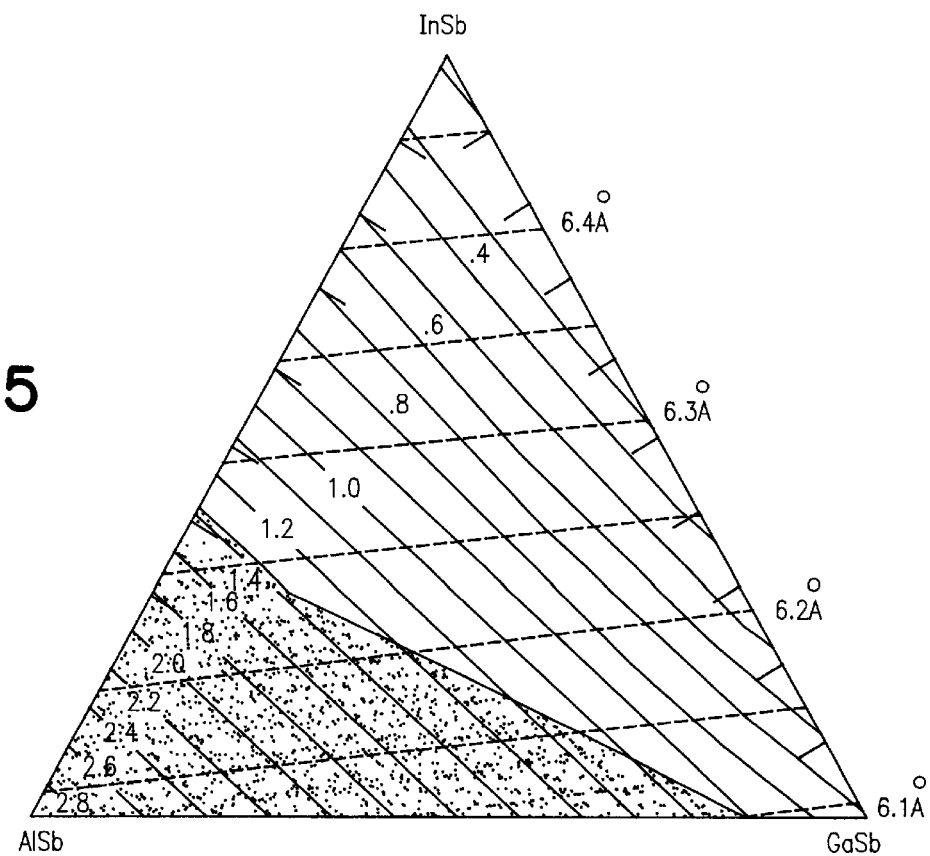
FIG. 5 shows a graph of energy gap and lattice constant versus composition of AlGaInSb.
Figure 6:
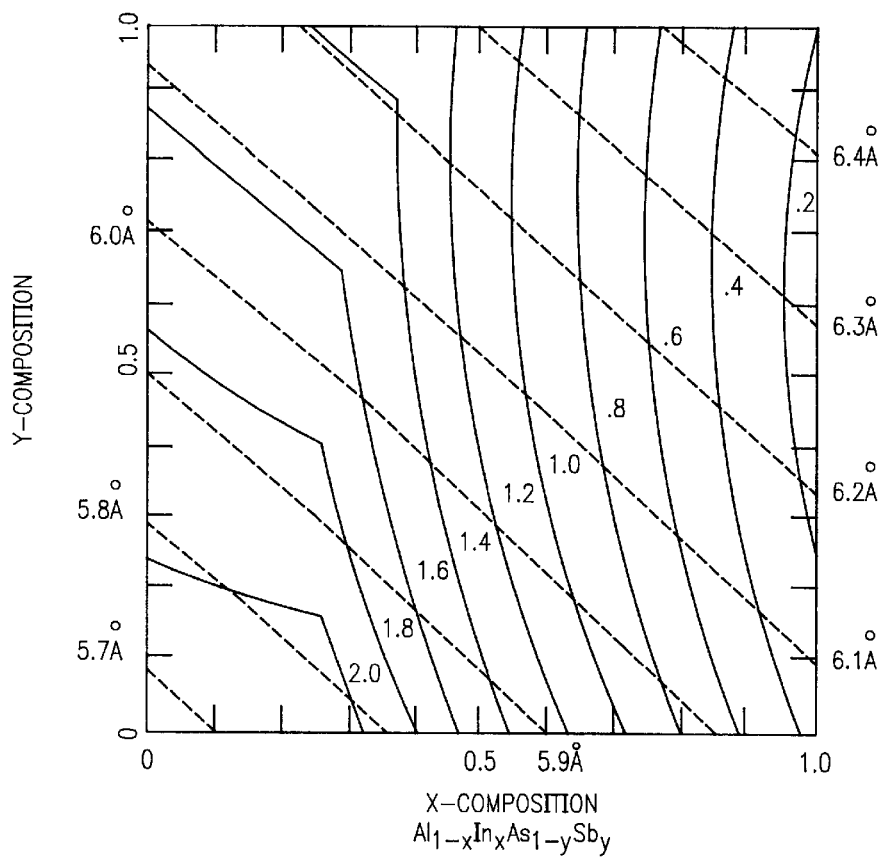
FIG. 6 shows a graph of energy gap and lattice constant versus composition of AlInAsSb.
Figure 7:
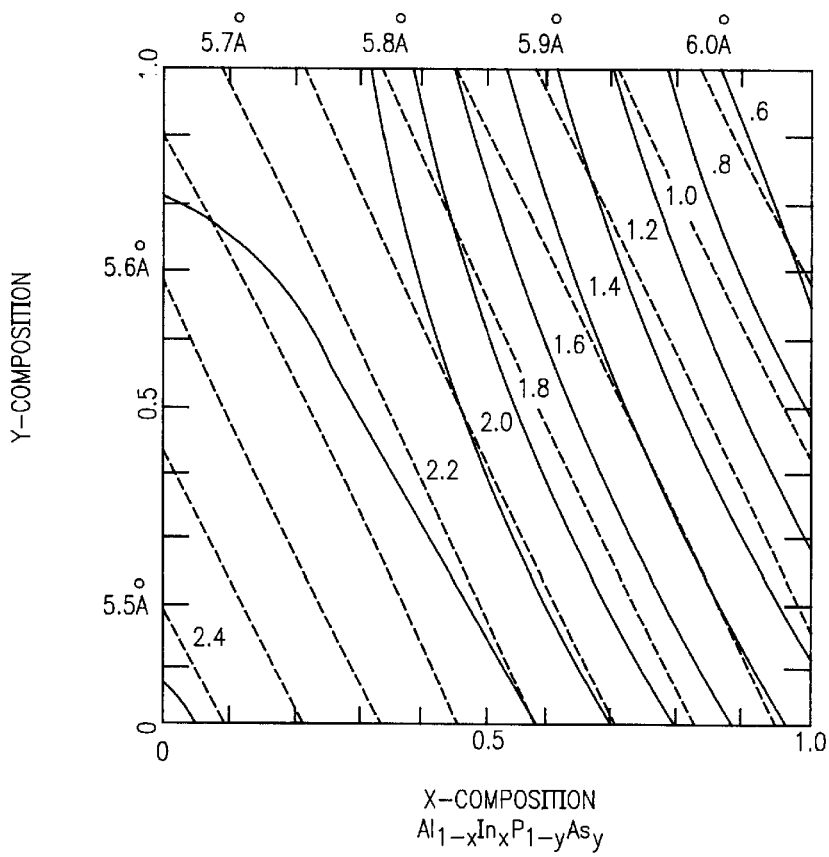
FIG. 7 shows a graph of energy gap and lattice constant versus composition of AlInPAs.
Figure 8:
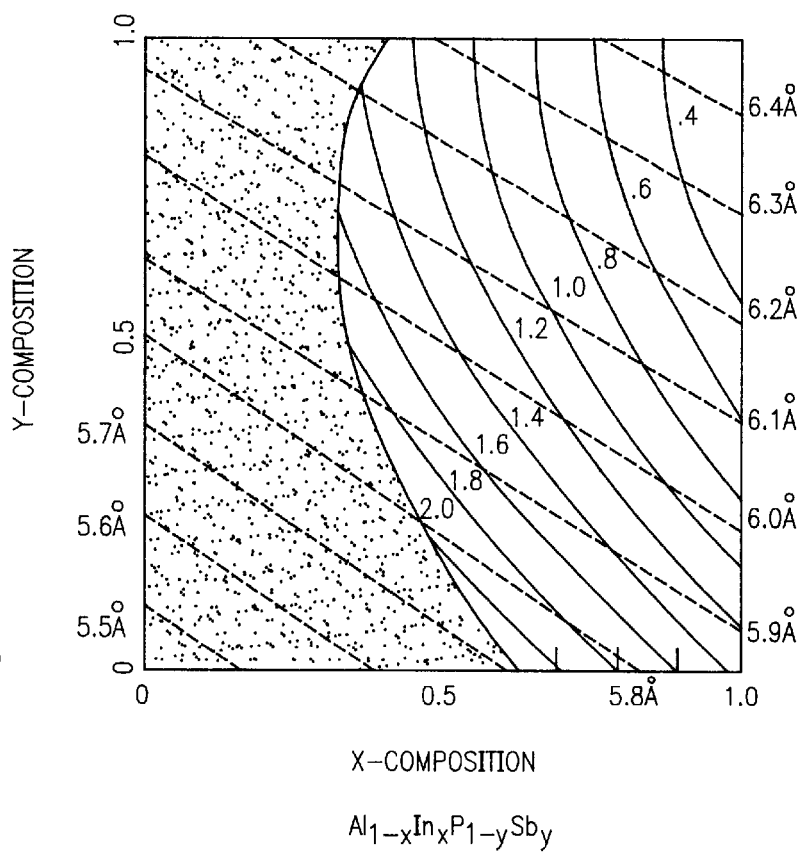
FIG. 8 shows a graph of energy gap and lattice constant versus composition of AlInPSb.
Figure 9:
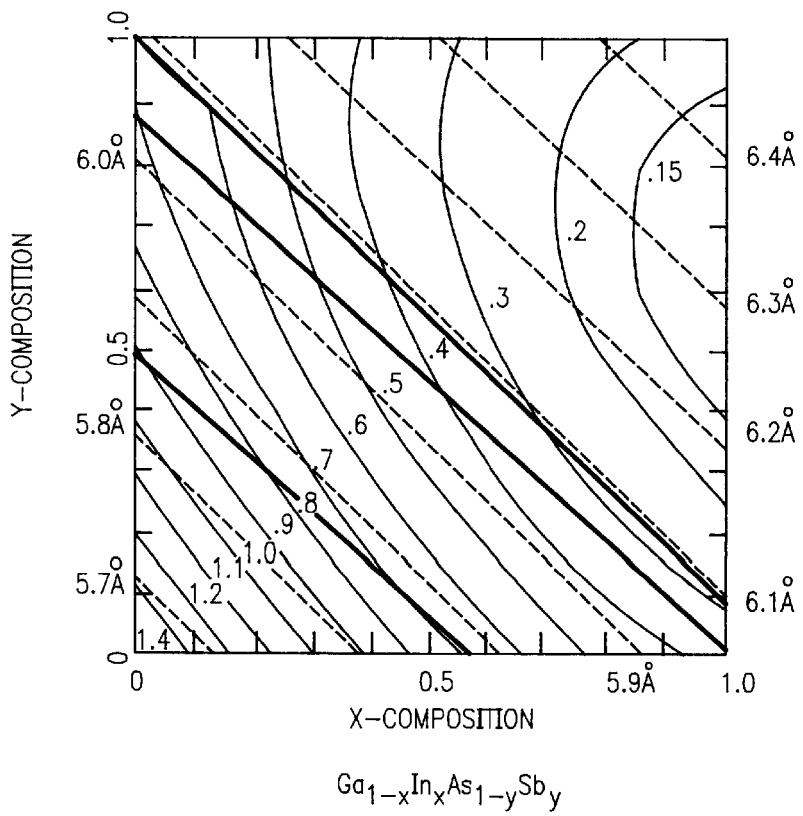
FIG. 9 shows a graph of energy gap and lattice constant versus composition of GaInAsSb.
Figure 10:
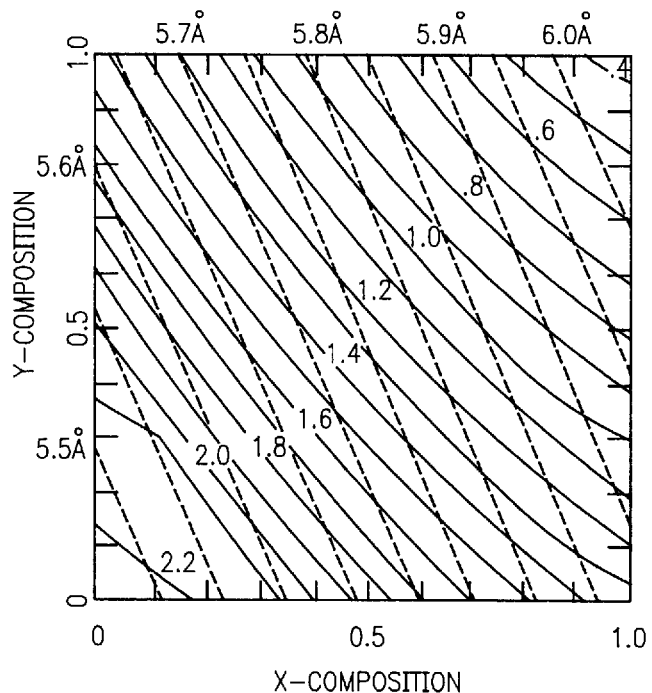
FIG. 10 shows a graph of energy gap and lattice constant versus composition of GaInPAs.
Figure 11:
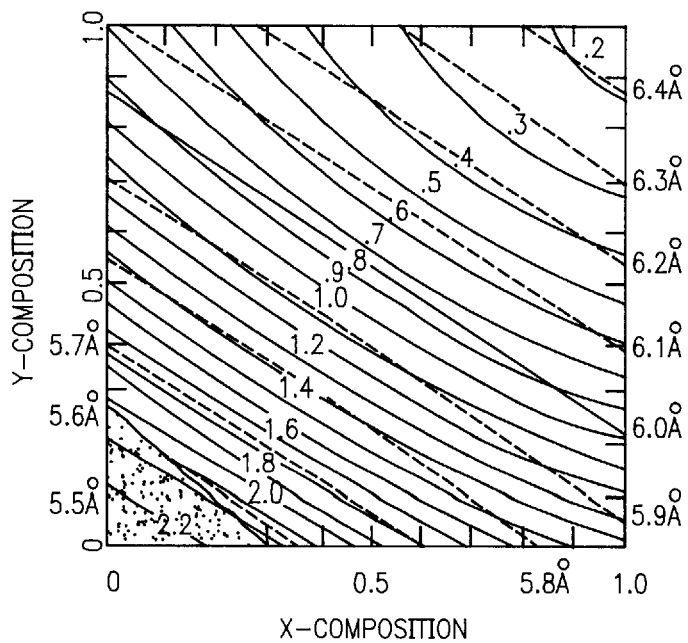
FIG. 11 shows a graph of energy gap and lattice constant versus composition of GaInPSb.
Figure 12:
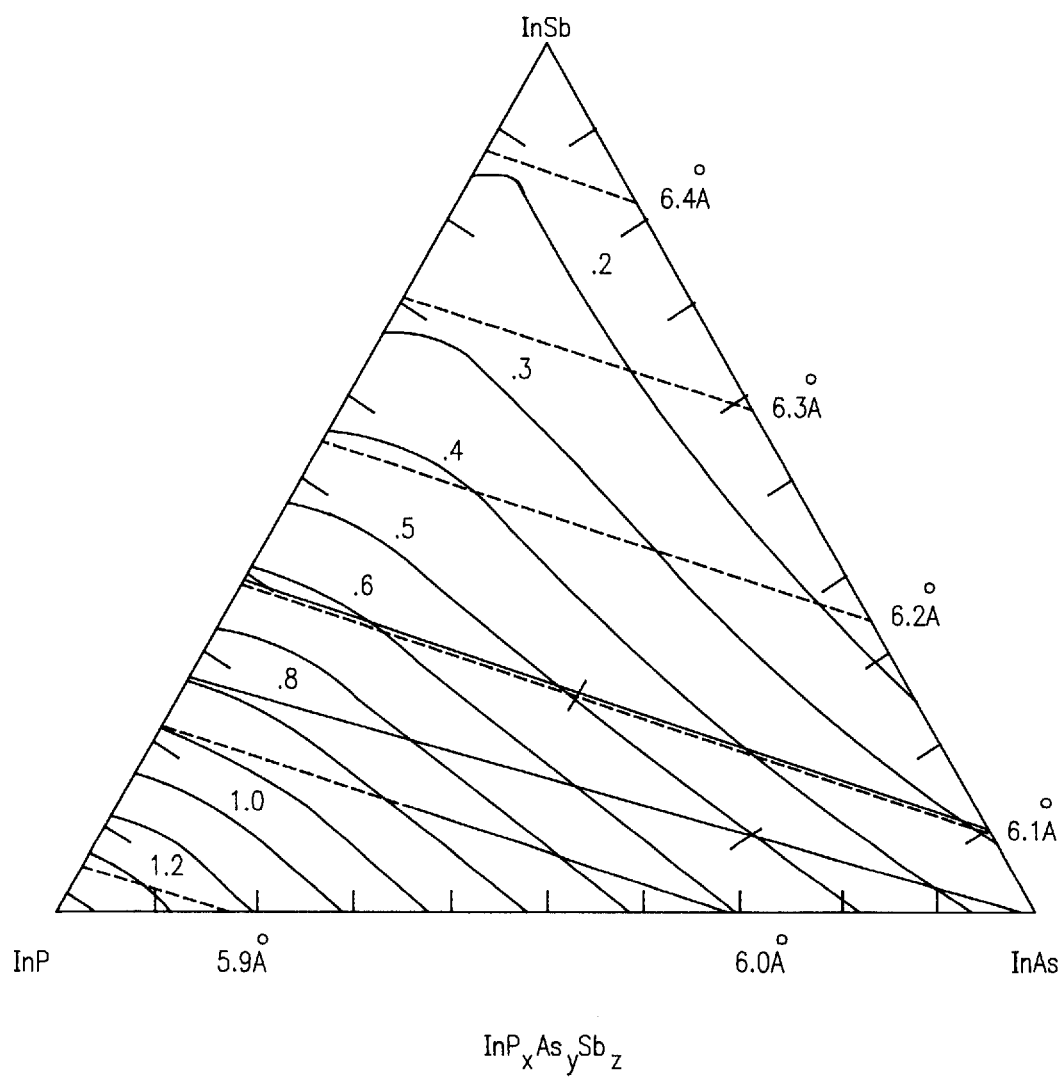
FIG. 12 shows a graph of energy gap and lattice constant versus composition of InPAsSb.

Ternary substrates also enable lattice-matched growth of ternary or quaternary semiconductor materials for TPV active layers. FIG. 3 shows a cross-sectional diagram of a ternary substrate TPV device having epitaxially grown lattice-matched ternary or quaternary active layers. An n- or p-type bulk single crystal ternary substrate 20 provides an epitaxial seed crystal. A first lattice-matched ternary or quaternary layer 21 is epitaxially grown on substrate 20. A second lattice-matched ternary or quaternary layer 22 is epitaxially grown on layer 21. Front side metal grids 13 and back contacts 11 are formed on layer 22 and substrate 20, respectively, using conventional techniques. Ternary substrates for the device of FIG. 3 may have any bandgap and only require lattice-matched active layers.

Substrates available for the device of FIG. 3 include AlAsSb, AlGaSb, AlInAs, AlInSb, GaAsSb, GaInAs, GaInSb, and InPAs. Potential lattice-matched active layers are determined by examining the energy gap and lattice constants of the various potential ternary and quaternary alloys, as shown in FIGS. 4–12. In particular, the lattice constant of a ternary substrate candidate must be matched to ternary or quaternary active layers with the appropriate bandgap of 0.4–0.7 eV and lattice constant. FIGS. 4–12 show that there are numerous potential high quality material systems that may be utilized for TPV applications. Table I tabulates all candidate ternary and quaternary active layers (for the embodiment as shown in FIG. 3) for each of the ternary substrates listed above.

TABLE I

| Ternary Substrate | Ternary or Quaternary Active Layer (with 0.4–0.7 eV bandgap) (Lattice-matched to ternary substrate) |
|---|---|
| AlAsSb | AlInAs, GaAsSb, GaInAs, GaInSb, InPAs, AlGaAsSb, AlGaInAs, AlInAsSb, AlInPAs, AlInPSb, GaInAsSb, GaInPAs, GaInPSb, InPAsSb |
| AlGaSb | GaInSb, AlGaInSb, AlInAsSb, AlInPSb, GaInAsSb, GaInPSb, InPAsSb |
| AlInAs | AlInAs, GaAsSb, GaInAs, InPAs, AlGaAsSb, AlGaInAs, AlInAsSb, AlInPAs, AlInPSb, GaInAsSb, GaInPAs, GaInPSb, InPAsSb |
| AlInSb | GaInSb, AlGaInSb, AlInAsSb, AlInPSb, GaInAsSb, GaInPSb, InPAsSb |
| GaAsSb | AlInAs, GaAsSb, GaInAs, InPAs, AlGaAsSb, AlGaInAs, AlInAsSb, AlInPAs, AlInPSb, GaInAsSb, GaInPAs, GaInPSb, InPAsSb |
| GaInAs | AlInAs, GaAsSb, GaInAs, InPAs, AlGaAsSb, AlGaInAs, AlInAsSb, AlInPAs, AlInPSb, GaInAsSb, GaInPAs, GaInPSb, InPAsSb |
| GaInSb | GaInSb, AlGaInSb, AlInAsSb, AlInPSb, GaInAsSb, GaInPSb, InPAsSb |
| InPAs | AlInAs, GaAsSb, GaInAs, InPAs, AlGaAsSb, AlGaInAs, AlInAsSb, AlInPAs, AlInPSb, GaInAsSb, GaInPAs, GaInPSb, InPAsSb |

While the present invention has been described in connection with the illustrated embodiments, it will be appreciated and understood that modifications may be made without departing, from the true spirit and scope of the invention.

What is claimed is:

1. A thermophotovoltaic energy conversion device comprising a substrate formed from a bulk single crystal material having a bandgap ($E_g$) of 0.4 eV<$E_g$<0.7 eV and selected from the group of AlInAs, AlInSb, GaAsSb, GaInAs, GaInSb, and InPAs, and an emitter fabricated on the substrate, wherein the emitter is formed by adding an n-type or p-type dopant material to the upper portion of the substrate.

2. A thermophotovoltaic energy conversion device according to claim 1, wherein the bulk single crystal material is an n-type material or a p-type material.

3. A thermophotovoltaic energy conversion device according to claim 1, wherein the emitter is formed by ion-implantation of the dopant into the upper portion of the substrate.

4. A thermophotovoltaic energy conversion device according to claim 1, wherein the emitter is formed by diffusion of the dopant into the top upper portion of the substrate.

5. A thermophotovoltaic energy conversion device comprising:

a host substrate formed from a bulk single crystal material selected from the group of AlAsSb, AlInAs, GaAsSb, GaInAs and InPAs; and lattice-matched ternary or quaternary III-V semiconductor active layers having a bandgap of 0.4–0.7 eV.

6. A thermophotovoltaic energy conversion device according to claim 5 wherein the active layers are formed from one of the group of AlInAs, GaAsSb, GaInAs, InPAs, AlGaAsSb, AlGaInAs, AlInAsSb, AlInPAs, AlInPSb, GaInAsSb, GaInPAs, GaInPSb, and InPAsSb.

7. A thermophotovoltaic energy conversion device according to claim 6, wherein when the host substrate is AlAsSb, the group from which the semiconductor active layers are formed further includes GaInSb.

8. A thermophotovoltaic energy conversion device comprising:

a host substrate formed from a bulk single crystal material selected from the group of AlGaSb, AlInSb, and GaInSb; and lattice-matched ternary or quaternary III-V semiconductor active layers having a bandgap of 0.4–0.7 eV.

9. A thermophotovoltaic energy conversion device according to claim 8 wherein the active layers are formed from one of the group of GaInSb, AlGaInSb, AlInAsSb, AlInPSb, GaInAsSb, GaInPSb, and InPAsSb.

10. A method of forming a thermophotovoltaic energy conversion device, the method comprising the steps of:

forming a substrate from a bulk single crystal material having a bandgap ($E_g$) of 0.4 eV<$E_g$<0.7 eV; the bulk single crystal material selected from the group of AlInAs, AlInSb, GaAsSb, GaInAs, GaInSb, and InPAs; and forming a p-type or n-type emitter on the substrate by adding a dopant to the upper portion of the substrate.

11. The method according to claim 10, wherein the substrate is an n-type material or a p-type material.

12. The method according to claim 10, wherein the emitter is formed by ion-implantation of the dopant into the upper portion of the substrate.

13. The method according to claim 10, wherein, the emitter is formed by diffusion of the dopant into the upper portion of the substrate.

14. A method of forming a thermophotovoltaic energy conversion device, the method comprising the steps of:

forming a host substrate from a bulk single crystal material selected from the group of AlAsSb, AlInAs, GaAsSb, GaInAs, and InPAs; and forming by epitaxial growth on said substrate, lattice-matched ternary or quaternary III-V semiconductor active layers having a bandgap of 0.4–0.7 eV.

15. The method of claim 14 wherein the active layers comprise a base layer and an emitter layer, the layers formed from one of the group of AlInAs, GaAsSb, GaInAs, InPAs, AlGaAsSb, AlGaInAs, AlInAsSb, AlInPAs, AlInPSb, GaInAsSb, GaInPAs, GaInPSb, and InPAsSb.

16. The method according to claim 15, wherein when the host substrate is AlAsSb, the group from which the semiconductor active layers are formed further includes GaInSb.

17. A method of forming a thermophotovoltaic energy conversion device, the method comprising the steps of:

forming a host substrate from a bulk single crystal material selected from the group of AlGaSb, AlInSb, and GaInSb; and forming by epitaxial growth on said substrate, lattice-matched ternary or quaternary III-V semiconductor active layers having a bandgap of 0.4–0.7 eV.

18. The method according to claim 17 wherein the active layers comprise a base layer and an emitter layer, the layers formed from one of the group of GaInSb, AlGaInSb, AlInAsSb, AlInPSb, GaInAsSb, GaInPSb, and InPAsSb.

* * * * *